US008164377B1

(12) United States Patent
DiTommaso

(10) Patent No.: US 8,164,377 B1
(45) Date of Patent: Apr. 24, 2012

(54) SIGNAL DEPENDENT COMPENSATION WITH MATCHED DETECTORS

(75) Inventor: Vincenzo DiTommaso, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 1007 days.

(21) Appl. No.: 11/354,592

(22) Filed: Feb. 14, 2006

Related U.S. Application Data

(60) Provisional application No. 60/738,751, filed on Nov. 21, 2005.

(51) Int. Cl.
*G06G 7/24* (2006.01)

(52) U.S. Cl. ....................................................... 327/350

(58) Field of Classification Search .................. None
See application file for complete search history.

(56) References Cited

U.S. PATENT DOCUMENTS

| 4,162,454 | A |   | 7/1979  | Olsen |
|-----------|---|---|---------|-------|
| 4,990,803 | A |   | 2/1991  | Gilbert |
| 5,077,541 | A |   | 12/1991 | Gilbert |
| 5,298,811 | A | * | 3/1994  | Gilbert ........................... 327/351 |
| 5,684,431 | A |   | 11/1997 | Gilbert et al. |
| 6,429,720 | B1 |  | 8/2002  | Gilbert |
| 6,437,630 | B1 |  | 8/2002  | Gilbert |
| 6,552,591 | B1 | * | 4/2003 | Abadi et al. .................. 327/306 |
| 6,894,544 | B2 |  | 5/2005  | Gubbins |
| 6,894,564 | B1 |  | 5/2005  | Gilbert |
| 7,102,302 | B2 |  | 9/2006  | George |
| 7,102,415 | B1 |  | 9/2006  | Potanin et al. |
| 7,196,569 | B1 | * | 3/2007 | DiTommaso .................. 327/350 |
| 2004/0017224 | A1 | | 1/2004 | Tumer et al. |
| 2006/0009887 | A1 | | 1/2006 | Rubin et al. |
| 2006/0082396 | A1 | | 4/2006 | Steinacker |

OTHER PUBLICATIONS

Kurpis and Booth, The New IEEE Standard Dictionary of Electrical and Electronics Terms, The Institute of Electrical and Electronics Engineers, Inc., Jan. 1993, New York, NY pp. 43 and 1059.
Cory and Halford, Make Precise Base-Station Power Measurements, Microwaves & RF, Nov. 2002, Wilmington, MA, pp. 72-81.
E. Brunner and B. Gilbert, Analog Devices, Inc.; *The Active Feedback Amplifier—A Versatile Analog Building Block*, pp. 131-136.
B. Gilbert, Analog Devices, Inc.; *Monolithic Logarithmic Amplifiers*, Aug. 1994, pp. 1-122.
U.S. Appl. No. 10/449,731, filed May 29, 2003, Gilbert.
U.S. Appl. No. 11/020,897, filed Dec. 22, 2004, DiTommaso.
U.S. Appl. No. 11/058,085, filed Feb. 14, 2005, DiTommaso.
U.S. Appl. No. 11/089,043, filed Mar. 22, 2005, DiTommaso.
U.S. Appl. No. 11/355,318, filed Feb. 14, 2006, DiTommaso.

(Continued)

*Primary Examiner* — Lincoln Donovan
*Assistant Examiner* — Khareem E Almo
(74) *Attorney, Agent, or Firm* — Marger Johnson & McCollom PC

(57) ABSTRACT

A detector circuit includes a main path having a first detector to generate an output signal in response to an input signal, and a reference path having a second detector matched to the first detector to generate a reference signal in response to the input signal. The reference signal may be used to compensate the output signal for variations in operating frequency, temperature, or the like. The reference path may be arranged to reuse a signal available in the main path so that the signal applied to the second detector experiences the same operating effects as that applied to the first detector.

16 Claims, 14 Drawing Sheets

OTHER PUBLICATIONS

Kurpis and Booth, The New IEEE Standard Dictionary of Electrical and Electronics Terms, The Institute of Electrical and Electronics Engineers, Inc., Jan. 1993, New York, NY, cover page, copyright page, and p. 346 (3 pages).

* cited by examiner

LOW GAIN NO SQUARE LAW    LOW GAIN/ SENSITIVITY    LOW GAIN NO SQUARE LAW

US 8,164,377 B1

SIGNAL DEPENDENT COMPENSATION WITH MATCHED DETECTORS

This application claims priority from U.S. Provisional Application Ser. No. 60/738,751 entitled Signal Dependent Compensation with Matched Detectors, filed Nov. 21, 2005, which is incorporated by reference.

BACKGROUND

Radio Frequency (RF) measurement systems typically include detector circuits to measure parameters such as power. One type of detector circuit is a logarithmic amplifier ("log amp") which generates an output signal $V_{OUT}$ that is related to its input signal $V_{IN}$ by the following function:

$$V_{OUT} = V_Y \log(V_{IN}/V_Z) \quad \text{Eq. 1}$$

where $V_Y$ is the slope and $V_Z$ is the intercept as shown in idealized form in FIG. 1. Progressive compression type log amps achieve the logarithmic transfer function through the combined effect of multiple gain stages and detector cells that approximate a logarithmic law.

FIG. 2 illustrates a prior art progressive compression log amp which includes a series of cascaded gain stages 10, each of which has a relatively low linear gain up to some critical level. Above the critical level, the gain of each stage is limited to a lower level—in some cases to zero. Thus, they are also referred to as amplifier/limiter stages. A series of detector cells 12 are connected to corresponding gain stages. The outputs of the detector cells are added together to generate the log output signal. In this example, the detector cell outputs are current mode signals, so they can be added together through a simple summing connection at node N1.

FIG. 3 illustrates a prior art detector cell based on three transistors arranged as a rectifying transconductance ($g_m$) cell. The emitter areas of the transistors are ratioed; that is, transistors Q1 and Q3 have a unit emitter area of "e", while transistor Q2 has an emitter area of D times e. The input signal is applied across the bases of Q1 and Q3 as a differential voltage $V_{IN}$. The base of Q2 is held at the midpoint of the input signal by the divider formed by input resistors $R_B$.

The bias current $I_T$ (also referred to as a quiescent or tail current) through transistors Q1-Q3 is generated by a bias transistor QA. The level of bias current $I_T$ is determined by the voltage applied to the base of QA. An operational amplifier (op amp) 14 maintains the base of QA at the voltage $V_{REF}$ which is typically generated by a precision voltage reference. The same reference voltage is also applied to the bases of additional bias transistors QB, QC, etc., which provide the same bias current to the other detector cells.

The collector currents of Q1 and Q3 are summed together to form one detector output current $I_P$, while the collector current of Q2 provides another output current $I_N$. Either or both of the output currents may be used to generate the final logarithmic output. If $I_P$ is used as the sole output signal, the current $I_N$ may be diverted to a positive power supply $V_P$, and the output current $I_P$ has the form shown in FIG. 4. $I_0$ is the output current when the input signal is zero, that is, $V_{IN}=0$. $I_L$ is the limit of the signal available from the detector cell when the input signal is large. Thus the maximum current swing M available at the detector output is $M=I_L-I_0$ and is related to the bias current $I_T$ and the emitter area ratio D.

FIG. 5 illustrates the detector cell output current $I_P$ in logarithmic form for several detector cells in a progressive compression log amp in which each detector cell is implemented using the $I_P$ output from the circuit of FIG. 3. The curves are shown as a function of the log input signal LOG INPUT on a logarithmic scale. The right-most curve in FIG. 5 is for the first detector cell, the next curve is for the second detector cell, etc. Each curve is offset relative to the others because the input $V_{IN}$ to any specific detector cell is shifted relative to the main LOG INPUT signal depending on its location along the cascade of gain stages. Thus, each curve is offset from its adjacent curve by an amount that is related to the gain A of each gain stage 10. Assuming each detector cell is fabricated using identical components on an integrated circuit, $I_L$, $I_0$, and M will be essentially identical for each detector cell.

FIG. 6 illustrates the final output signal obtained by summing together the output currents $I_P$ from all of the detector cells. The final output signal approximates the ideal log function shown in FIG. 1. Since each of the individual curves shown in FIG. 5 has the same maximum output swing M, the slope of the final output signal is strongly dependent on the value of M which determines the height of each of the piecewise linear approximation sections in the final output function.

Referring back to FIG. 3, if the other output current $I_N$ is used to generate the final logarithmic output, $I_P$ may be diverted to the power supply, and the $I_N$ output has an inverted shape as shown in FIG. 7. In this case, summing together the $I_N$ outputs from all of the detector cells produces a final log output signal having a negative slope as shown in FIG. 8. Note that in either case, the relative vertical position of the individual curves in FIGS. 5 and 7 generally does not affect the log slope. That is, a DC offset may be added to the curves in FIGS. 5 and 7 to shift them up or down without affecting the maximum output swing M that determines the slope of the final logarithmic output.

Another type of detector circuit is based on a variable gain amplifier (VGA) arranged to drive one of a pair of detectors, for example, a pair of squaring cells arranged to implement a "difference of squares" function. FIG. 9 illustrates a prior art power detection circuit that includes a VGA 15 and two identical squaring cells 16 and 18. The VGA amplifies the input signal $V_{IN}$ with a gain determined by a gain control signal $V_G$. The output from the VGA drives squaring cell 16 which generates an output signal (or squared signal) $I_{SQR}$. A DC reference signal $V_{REF}$ is applied to squaring cell 18 which generates $I_{REF}$. A nulling circuit 20 generates the final output signal $V_{OUT}$ in response to $I_{SQR}$ and $I_{REF}$. The circuit of FIG. 9 can be configured for operation in a measurement mode, in which case the final output signal $V_{GUT}$ is fed back to the VGA and used as the gain control signal $V_G$. It can also be configured in a controller mode, in which case the final output signal $\backslash T_{our}$ is used to control the gain or power of a device such as a power amplifier. In controller mode, a sample of the output from the power amplifier is fed back to the input terminal of the VGA as the input signal $V_{IN}$, and the control signal $V_G$ is then used as a set-point signal. In either mode, the system servos until the average of $I_{SQR}$ equals $I_{REF}$.

Since detector circuits are used in measurement systems, accuracy is a primary concern. However, a variety of factors tend to degrade the accuracy of detectors. For example, variations in operating frequency and temperature tend to cause the actual detector output to deviate from the ideal output, as do variations in power supply voltage. Differences in device characteristics due to variations in manufacturing processes also introduce errors.

In a monolithic integrated circuit (IC) implementation of a progressive compression log amp, temperature compensation of the slope $V_Y$ is typically provided by utilizing proportional to absolute temperature (PTAT) bias currents for the gain and detector cells since those are the structures that determine the slope. Temperature stabilization of the intercept $V_Z$ is typically provided at the front or back end of the log amp, for example, by interposing a passive attenuator with a loss that is proportional to absolute temperature (PTAT) between the signal source and the log amp. Another technique for temperature compensating the intercept of a log amp involves adding a carefully generated compensation signal to the output so as to cancel the inherent temperature dependency of the intercept. See, e.g., U.S. Pat. No. 4,990,803; and Barrie Gilbert, Monolithic Logarithmic Amplifiers, August 1994, §5.2.4.

Frequency compensation for log amps may also be problematic. For any given operating frequency, a predetermined compensation signal may be added to the output, thereby providing an accurate output at the given frequency but resulting in unacceptable errors at other frequencies. This problem may be compounded by "peaking" in the frequency response which causes non-monotonic behavior of the compensation. That is, the value of the required compensation signal may initially increase as the operating frequency increases, but a peak may be reached, at which point the value of the required compensation signal begins decreasing with further increases in operating frequency. Thus, the required compensation may be a nonlinear function.

Temperature and frequency compensation for a power detection circuit having a VGA and difference of squares detectors may present similar problems. Although the use of identical squaring cells may provide temperature compensation to the detector cells, the DC reference signal $V_{REF}$ shown in FIG. 9 causes the second squaring cell to dwell at a single DC operating point that provides no frequency-related contribution to its compensation effects. If the circuit of FIG. 9 is used in a control configuration for an input signal having a carrier frequency that is modulated by a baseband signal, then some amount of frequency compensation may be achieved by applying the baseband modulation signal as the $V_{REF}$ input to the second squaring cell. See, e.g., U.S. Pat. No. 6,429,720. This technique, however, requires prior access to the baseband modulation signal.

DETAILED DESCRIPTION

Feedback Compensation

Figure 10:
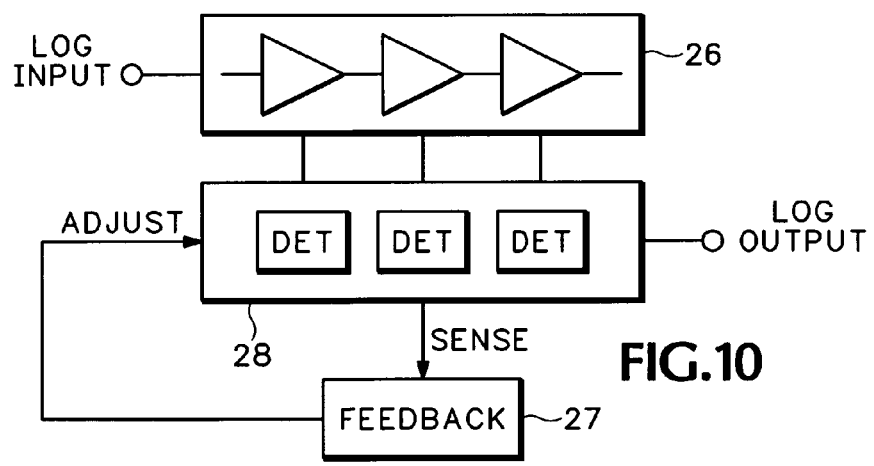
FIG. 10 illustrates an embodiment of a log amp according to the inventive principles of this patent disclosure.

FIG. 10 illustrates an embodiment of a log amp having a feedback loop according to the inventive principles of this patent disclosure. The embodiment of FIG. 10 includes a series of cascaded gain stages 26 and a series of detector cells 28 in which each detector cell is connected to a corresponding gain stage. The outputs of the detector cells are added together to generate the log output signal. A feedback circuit 27 controls the operation of the detector cells in response to an output from one or more detector cells.

The feedback loop in the embodiment of FIG. 10 enables the implementation of features such as slope compensation. For example, as discussed above, the output slope of a log amp may depend on the maximum signal swing M of the detector cells 28. The value of M, however, may be affected by factors such as the frequency of the input signal, process variations, temperature, power supply, etc. If the value of M, that is $I_L$-$I_0$, is held constant, the slope of the log amp may be stabilized. The feedback loop in the embodiment of FIG. 10 may allow the operation of the detector cells to be adjusted so as to maintain M at a constant value. In addition, $I_L$ and/or $I_0$ may be controlled by the feedback configuration, e.g., to maintain a constant intercept.

Figure 11:
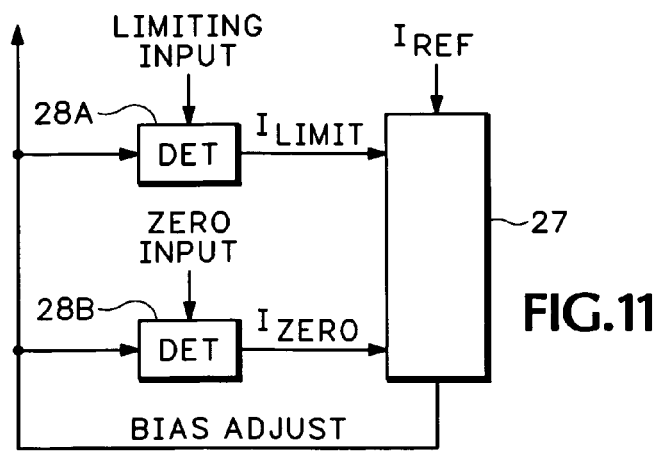
FIG. 11 illustrates an embodiment of a system for adjusting the bias of detector cells according to the inventive principles of this patent disclosure.

FIG. 11 illustrates an embodiment of a closed loop system that may be used to provide slope compensation to a log amp by adjusting the bias of detector cells according to the inventive principles of this patent disclosure. In the embodiment of FIG. 11, the series of detector cells includes a dedicated detector cell 28A that is arranged so that it essentially always operates in a limiting mode. That is, its output current $I_{LIMIT}$ is $I_L$. Another detector cell 28B is arranged so that it always outputs $I_0$. The feedback circuit 27 generates a signal BIAS ADJUST that servos the detector cells so as to maintain the difference between $I_{LIMIT}$ and $I_{ZERO}$ at a constant value determined by a reference signal $I_{REF}$. That is, $I_{LIMIT}$-$I_{ZERO}$=$I_{REF}$. Thus, by maintaining M at a constant value, the slope of the accompanying log amp may be stabilized if all of the detector cells are fabricated with matching components.

The reference signal $I_{REF}$ may be generated internally, as for example, by using an on-chip bandgap reference cell to generate a reference voltage that may be converted to a current signal. Alternatively, the reference signal may be applied from an external source to provide the user with a convenient way to adjust the slope of the log amp, or to provide the ability to compensate for other aspects of the operation of the log amp. For example, an on-chip bandgap cell may not be perfectly temperature stable, or it may be noisy enough to cause objectionable noise in the log amp output. By providing the ability to utilize an external reference signal, the user may achieve higher levels of accuracy in the slope and compensation depending on the type of external reference applied to the chip. This may also eliminate the need for an on-chip reference cell, which in turn, may result in lower power consumption, less die area (i.e., less expensive device), lower noise output, and/or more flexibility to the end user. Another advantage is that the slope may easily be adjusted either upward or downward. This is in contrast to conventional arrangements in which the slope could only be adjusted downward by putting a resistive divider in the setpoint interface.

Figure 12:
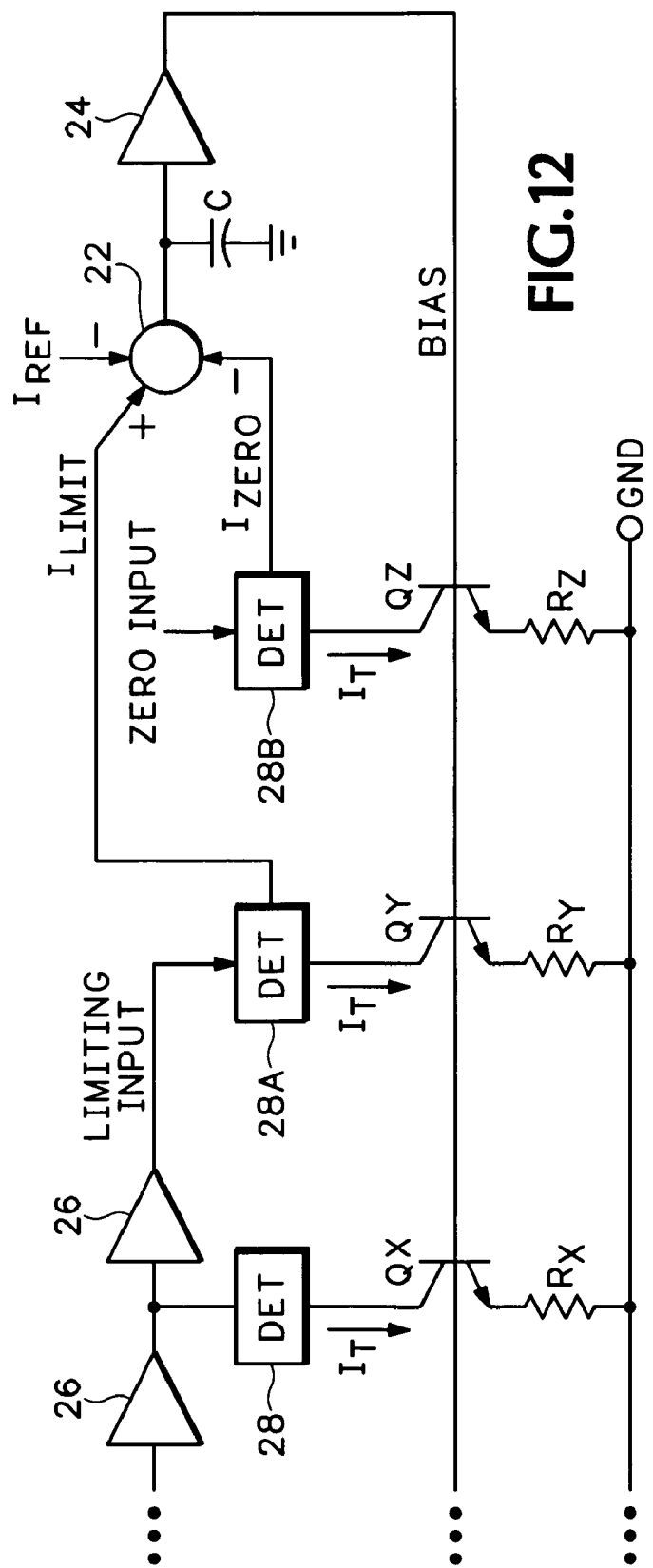
FIG. 12 illustrates another embodiment of a log amp according to the inventive principles of this patent disclosure.

FIG. 12 illustrates another embodiment showing some possible implementation details of a log amp according to the inventive principles of this patent disclosure. In the embodiment of FIG. 12, the limiting detector cell 28A is implemented by placing it at the end of the cascade of gain stages 26 and setting the gain so that even just noise forces its output to limit. The zero detector cell 28B is implemented by, for example, shorting its inputs together. The signals $I_{LIMIT}$, $I_{ZERO}$, and $I_{REF}$ are summed by a summing circuit 22. A capacitor C and buffer amplifier 24 integrate the output from the summing circuit to generate a bias signal BIAS which drives the bases of bias transistors QX, QY, QZ, etc., which in turn provide the bias currents $I_T$ to the detector cells.

Figure 13:
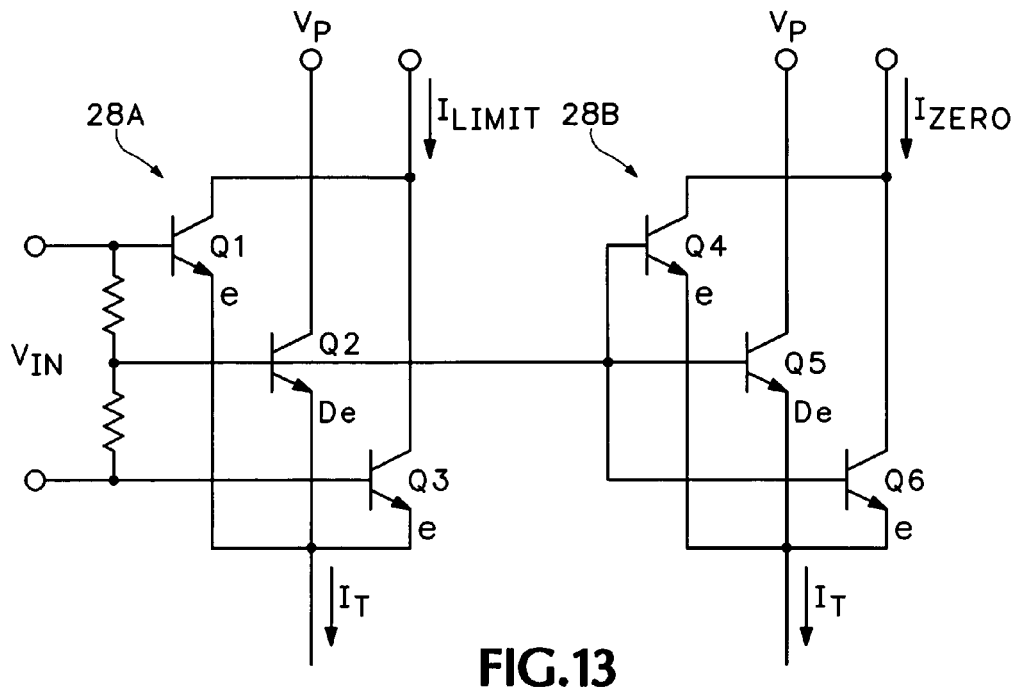
FIG. 13 illustrates an embodiment of limiting and zero detector cells according to the inventive principles of this patent disclosure.

FIG. 13 illustrates an alternative embodiment of limiting and zero detector cells according to the inventive principles of this patent disclosure. The embodiment of FIG. 13 includes a detector cell 28A that is forced into limiting operation by the output of a gain stage 26 that is arranged to always operate in limiting mode. Another detector cell 28B is forced to generate a zero signal $I_{ZERO}$ by tying its input terminals together. As an added feature, however, the inputs of the zero detector cell are also connected to the midpoint of the input to the limiting detector cell 28A. This imparts a ripple component to the $I_{ZERO}$ signal that may compensate for similar ripple components in output signals from the limiting detector cell ($I_{LIMIT}$) and other detector cells.

Signal Dependent Compensation with Matched Detectors

Figure 14:
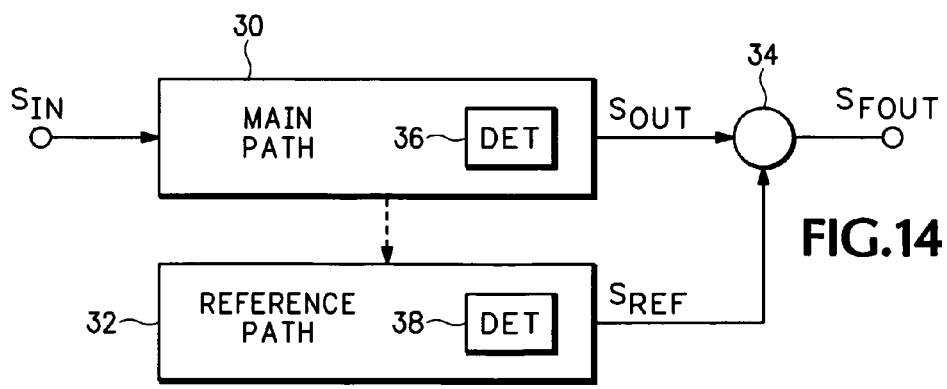
FIG. 14 illustrates an embodiment of a detector circuit according to the inventive principles of this patent disclosure.

FIG. 14 illustrates an embodiment of a detector circuit according to the inventive principles of this patent disclosure. The embodiment of FIG. 14 includes a main signal path 30 having some type of detector or detectors 36 used to generate an output signal $S_{OUT}$ in response to the input signal $S_{IN}$. A reference path 32 includes a detector 38 matched to a detector in the main path to generate a reference signal $S_{REF}$ in response to the input signal $S_{IN}$. The reference signal compensates the output signal to provide the final output signal $S_{FOUT}$. The reference signal may be coupled to the output signal by a circuit 34 which may include an adder, a simple summing node or nodes, an averaging circuit, a nulling circuit, or any other suitable circuitry through which the reference signal may compensate the output signal.

The main path 30 may include a log amp, a VGA and detector cell, or any other measurement circuit that employs a detector cell. The detector in the reference path is matched to a detector in the main path in that they both have one or more similar qualities that enable the reference signal $S_{REF}$ to compensate the output signal $S_{OUT}$ for variations in frequency, temperature, power supply, manufacturing processes, or the like.

The reference path 32 may be coupled to the main path 30 in any number of ways as shown by the broken line in FIG. 14 to allow the reference path to generate the reference signal in response to the input signal. For example, the reference path may receive the input signal directly in its original form $S_{IN}$. Alternatively, the input signal may be fully processed by the main path before it is coupled to the reference path as $S_{OUT}$, or it may be coupled to the reference path from an intermediate access point anywhere along the main path.

Figure 15:
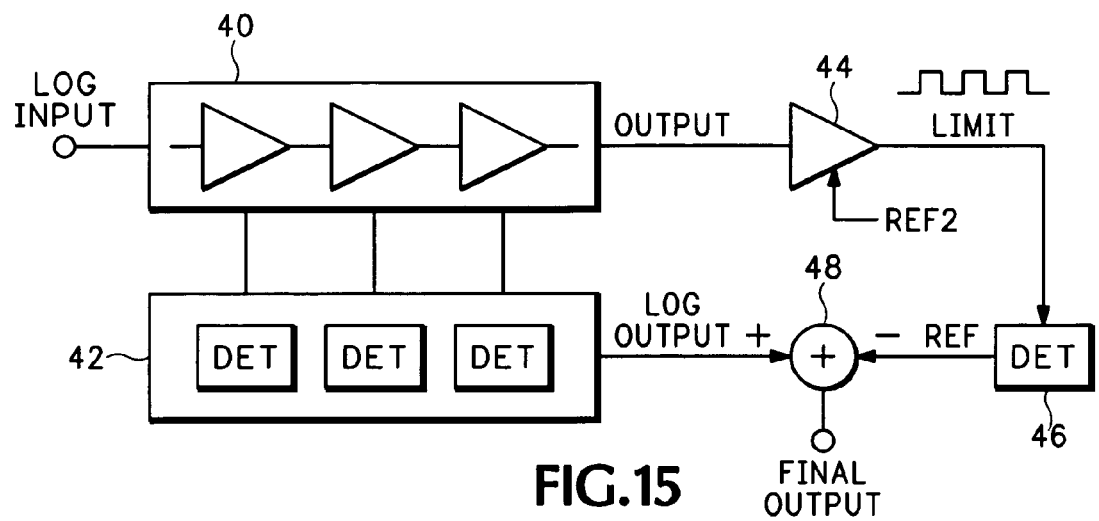
FIG. 15 illustrates an embodiment of a logarithmic amplifier according to the inventive principles of this patent disclosure.

FIG. 15 illustrates how the detector circuit of FIG. 14 may be embodied to compensate a logarithmic amplifier according to the inventive principles of this patent disclosure. In the embodiment of FIG. 15, the main path includes a progressive compression log amp having a series of cascaded gain stages 40 and a series of detector cells 42 in which each detector cell is connected to a corresponding gain stage. The outputs of the detector cells are summed to generate the log output signal LOG OUTPUT. The reference path includes a reference gain stage 44 that matches the gain stages 40, and a reference detector cell 46 that matches the series of detector cells 42. The input for the reference gain stage is taken from the output of the final gain stage in the series 40. The reference gain stage may be arranged to limit at the same frequency as the operating frequency of the series of gain stages. The limiting output signal LIMIT is then applied to the reference detector 46. A second reference signal REF2 may be applied to the reference gain stage to provide an additional measure of control. For example, a bandgap signal may be applied as REF2 to control the amplitude of the limiting signal, and to provide an absolute power reference. The reference output REF from the reference detector is added to the log output signal LOG OUTPUT from the main path by an adder circuit 48 to generate the final output signal.

Depending on the implementation details, the embodiment of FIG. 15 may be able to provide compensation for several different operating parameters. For example, in a monolithic IC implementation in which identical gain stages and detectors are used in both the main and reference paths, the reference detector may provide a reference signal with a defined amplitude (e.g., based on a bandgap signal) that operates at the exact same frequency as the input signal and is subject to the same temperature effects as the main output signal, thereby providing both frequency and temperature compensation.

A beneficial aspect of the embodiment of FIG. 15 is that it reuses a signal that was already available within the main path to generate the reference signal. Thus, the signal applied to the reference gain stage has been through the entire series of log amp gain stages and was subjected to the exact same frequency and temperature effects.

Figure 16:
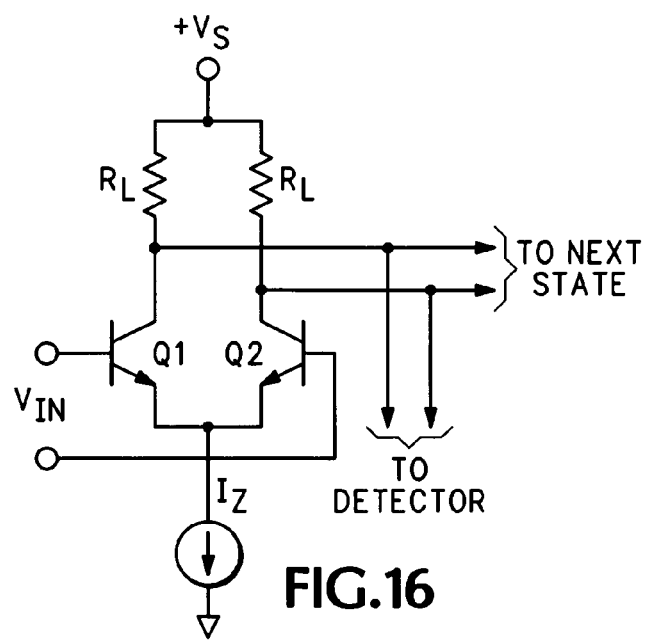
FIG. 16 illustrates an embodiment of a gain stage suitable for use in a logarithmic amplifier according to the inventive principles of this patent disclosure.

FIG. 16 illustrates an example embodiment of a gain stage suitable for use in both the main and reference paths of FIG. 15 according to the inventive principles of this patent disclosure. The gain stage of FIG. 16 includes a differential pair of transistors Q1 and Q2 arranged as a transconductance ($g_m$) cell having load resistors $R_L$ and, in the case of the reference path biased by a stable current source $I_Z$. The gain stages in the series of log amp gain stages may instead be biased by PTAT current sources. The output from each stage, which is taken at the collectors of Q1 and Q2, is applied to the corresponding detector cell, and to the input of the next stage after level shifting, for example though a pair of emitter-follower transistors.

The gain of the reference gain stage is determined by $g_m R_L$ (and the swing by $I_Z R_L$) where the bias current $I_Z$ may be, for example, set by a bandgap signal to provide an absolute power reference. The overall gain of the series may be set so that the reference gain stage, being at the end of the series of gain stages in the main path, limits even in response to noise, i.e., with zero input signal. A factor to consider in setting the gain of the reference gain stage is the operating point of reference detector in the reference path.

Figure 17:
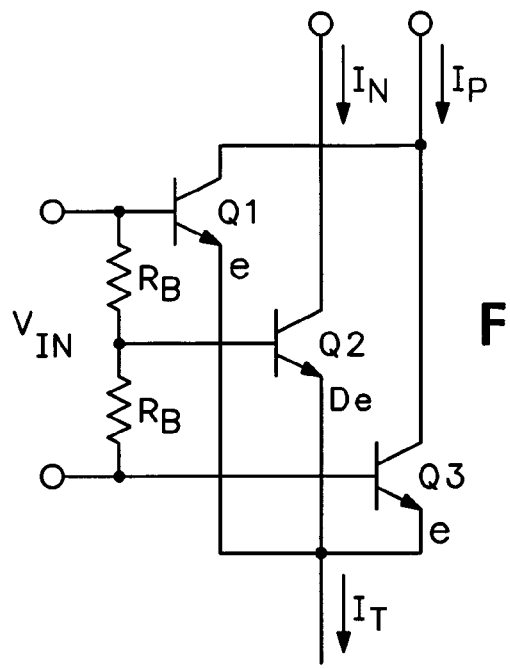
FIG. 17 illustrates an embodiment of a detector cell suitable for use in a logarithmic amplifier according to the inventive principles of this patent disclosure.

FIG. 17 illustrates an example embodiment of a detector cell suitable for use in both the main and reference paths. The detector cell of FIG. 17 includes three transistors arranged as a rectifying transconductance ($g_m$) cell. The emitter areas of the transistors are ratioed; that is, transistors Q1 and Q3 have a unit emitter area of "e", while transistor Q2 has an emitter area of D times e, or "De". The input signal is applied across the bases of Q1 and Q3 as a differential voltage $V_{IN}$. The base of Q2 is held at the midpoint of the input signal by the divider formed by input resistors $R_B$. The bias current $I_T$ (also referred to as a quiescent or tail current) through transistors Q1-Q3 may be set at any suitable operating point.

Figure 18:
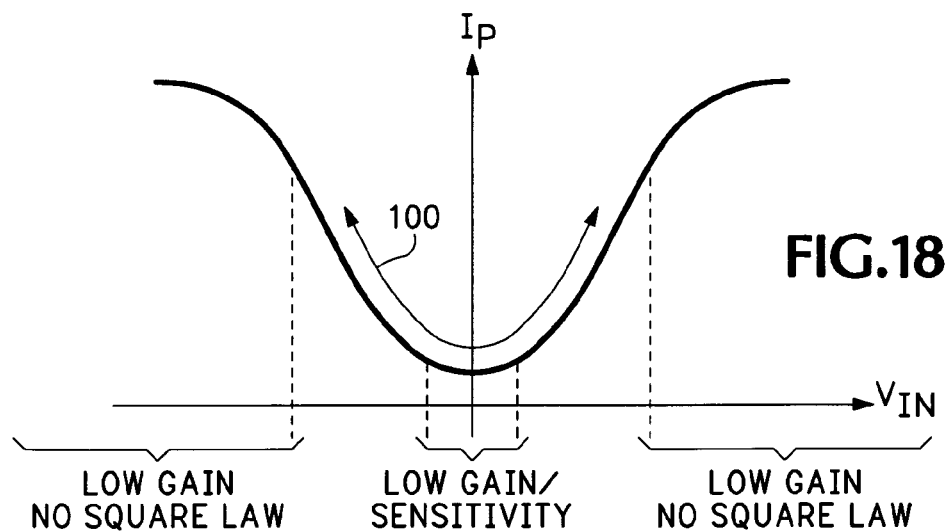
FIG. 18 illustrates the operation of the detector cell of FIG. 17.

FIG. 18 is a plot that illustrates the operation of the detector cell of FIG. 17. The gain of the reference gain stage may preferably be set so that its limiting output signal, when applied to the input of the detector, traverses most of the steep part of the curve at shown by arrow 100, but stops short of the "knees" where the curve flattens out as shown in FIG. 18. If the gain is set too low, the detector cell will dwell at the bottom of the "trough" where the gain and sensitivity is low. If the gain of the gain stage is set too high, the detector will operate past the knees where the detector gain is also low and the square law approximation of the detector cell breaks down.

For purposes of exploring the log intercept of the embodiment of FIG. 15, the main and reference paths may be treated as two separate log amps. Thus, in voltage terms, the output of the main path is given by:

$$V_{OUT} = V_Y \log(V_{IN}/V_Z) \quad \text{Eq. 2}$$

and the output of the reference path is given by $$V_{REF} = V_Y \log(V_0/V_Z) \quad \text{Eq. 3}$$

where identical gain stages and detectors are assumed to provide identical slopes $V_Y$ in both paths. Since the reference output is subtracted from the main output, the final output is given by $$V_{FOUT} = V_Y \log(V_{IN}/V_0) \quad \text{Eq. 4}$$

and the log intercept reduces to $V_0$. Therefore, since $V_0$ is determined by $I_Z R_L$ of the reference gain stage, an absolute power reference may be introduced through the bias current $I_Z$, while still allowing for optimization of the operating range of the reference detector through the amplitude of the limiting signal.

Figure 19:
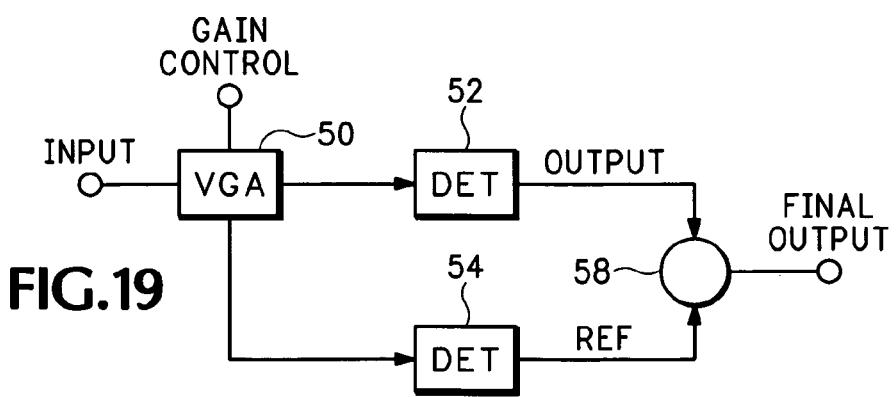
FIG. 19 illustrates an embodiment of a power detector according to the inventive principles of this patent disclosure.

FIG. 19 illustrates how the detector circuit of FIG. 14 may be embodied to compensate a difference of squares detector circuit according to the inventive principles of this patent disclosure. In the embodiment of FIG. 19, the main path includes a VGA 50 and a main detector 52. The reference path includes a reference detector 54 that is matched to the main detector and coupled to receive the input signal in some form from the VGA. A circuit 58 combines the reference signal from the reference detector with the output signal from the main detector to generate the final output. The circuit 58 may include an adder, a simple summing node or nodes, an averaging circuit, a nulling circuit, or any other suitable circuitry through which the reference signal may compensate the output signal. The VGA 50 may take any suitable form, for example, a transconductance stage with a variable bias current, an interpolated VGA, or a simple variable attenuator. Likewise, the detectors may be implemented with squaring cells, rectifiers, etc.

Figure 20:
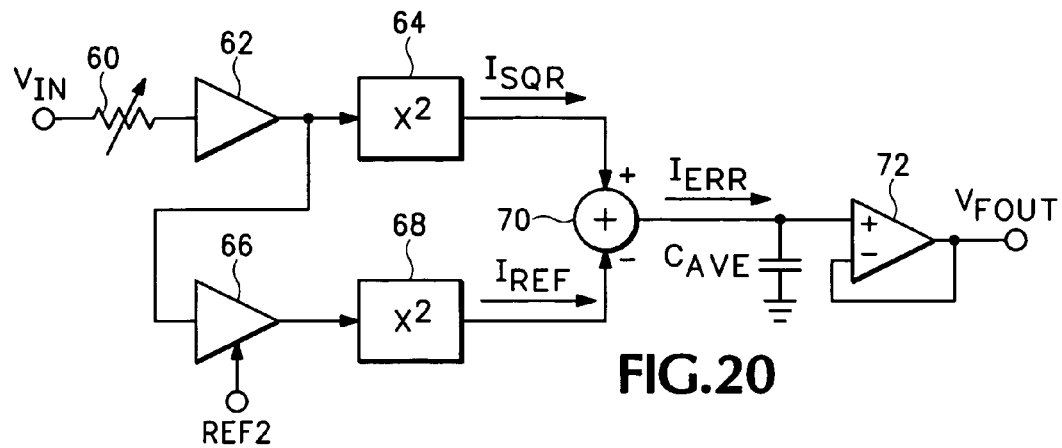
FIG. 20 illustrates another embodiment of a detector circuit according to the inventive principles of this patent disclosure.

FIG. 20 illustrates another embodiment of a detector circuit showing some possible implementation details according to the inventive principles of this patent disclosure. In the embodiment of FIG. 20, a VGA is formed from a variable attenuator 60 and main amplifier 62 that drives a squaring cell 64. The output of the main amplifier is reused by applying it to a reference gain stage 66 which drives the reference detector 68. The reference stage 66 may be arranged to provide an output that limits at the same frequency as the input signal $V_{IN}$, and at an amplitude that may be determined by a second reference signal REF2. A nulling circuit including summing circuit 70, averaging capacitor $C_{AVE}$, and buffer 72 servos the system to force the average of $I_{sQR}$ to equal the average of $I_{REF}$.

The second reference signal REF2, along with a gain control input to the VGA, may be utilized to configure the embodiment of FIG. 20 in various operating modes, and to impart various compensation characteristics to the system. For example, a bandgap derived signal may be coupled to REF2 to provide an absolute reference for power or any other parameter the circuit may be configured to measure or control. As another example, the embodiment of FIG. 20 may be arranged in a control configuration in which the final output is used to control a device such as a power amplifier (PA). A sample of the PA output may then be feed back to control the gain of the VGA, e.g., by controlling the variable attenuator 60. A setpoint signal may then be applied to the detector path, for example, by imparting it on the second reference signal REF2.

Compensation With Ratiometric Attenuation

Figure 21:
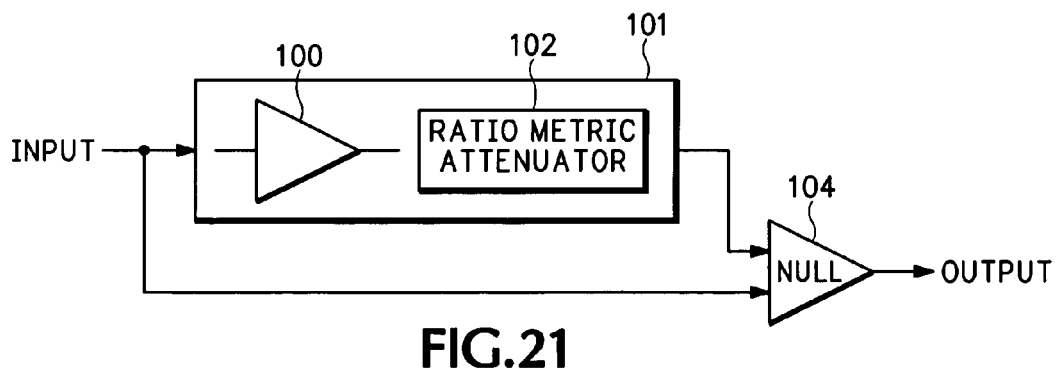
FIG. 21 illustrates an embodiment of a circuit having a gain stage and ratiometric attenuator according to the inventive principles of this patent disclosure.

FIG. 21 illustrates an embodiment of a circuit according to the inventive principles of this patent disclosure. The embodiment of FIG. 21 includes a ratiometric gain/attenuator circuit 101 that includes a gain stage 100 and a ratiometric attenuator 102. An input signal is applied to the ratiometric gain/attenuator circuit and to one of the inputs of a nulling circuit 104. The output from the ratiometric gain/attenuator circuit is applied to the other input of the nulling circuit. The ratiometric attenuator may include any arrangement of components that provides an attenuation factor that depends on a ratio of component values. For example, it may include a resistive divider in which the attenuation is determined not by the absolute value of a resistor, but rather by a ratio of two or more resistor values. The nulling circuit may be arranged in any suitable manner to null the input signal and the output from the ratiometric gain/attenuator circuit.

Figure 22:
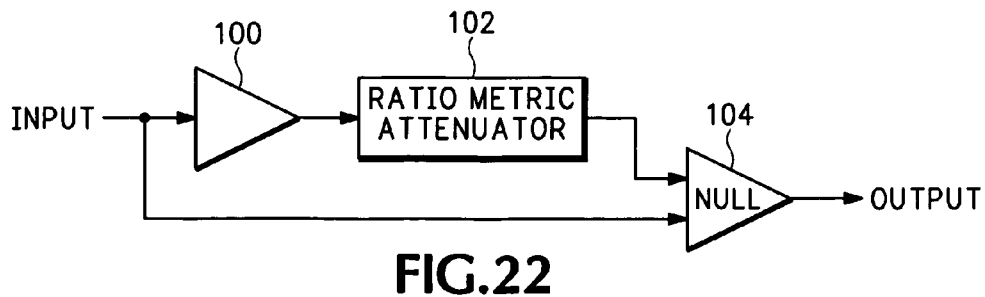
FIG. 22 illustrates another embodiment of a circuit having a gain stage and ratiometric attenuator according to the inventive principles of this patent disclosure.
Figures 28, 29:
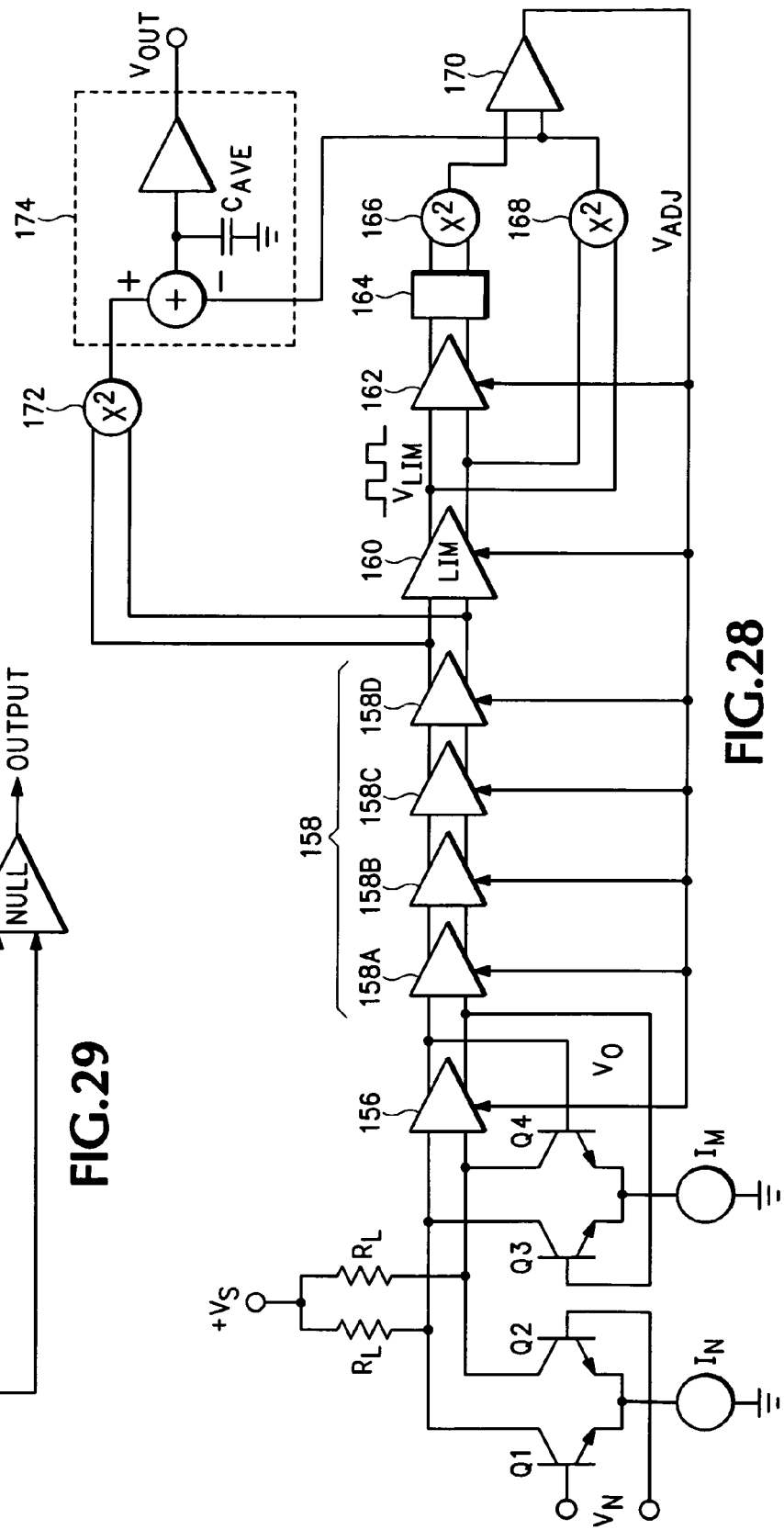
FIG. 28 illustrates an embodiment of another circuit according to the inventive principles of this patent disclosure.
FIG. 29 illustrates another embodiment of a circuit having a gain stage and ratiometric attenuator according to the inventive principles of this patent disclosure.

The gain stage 100 and a ratiometric attenuator 102 may be arranged in different configurations. For example, in the embodiment of FIG. 22, the gain stage 100 is arranged in series before the ratiometric attenuator 102. In another embodiment, the attenuator may precede the gain stage as shown in FIG. 29. The arrangement of components may be varied to accommodate different implementation details. For example, placing the gain stage first may be beneficial in some implementations to provide drive capacity to handle any parasitics presented by the attenuator load, whereas placing the attenuator first may help where it is advantageous to keep the input signal the gain stage small. Additionally, the attenuator may be implemented as a switched attenuator to provide a fixed or selectable gain value.

Figure 23:
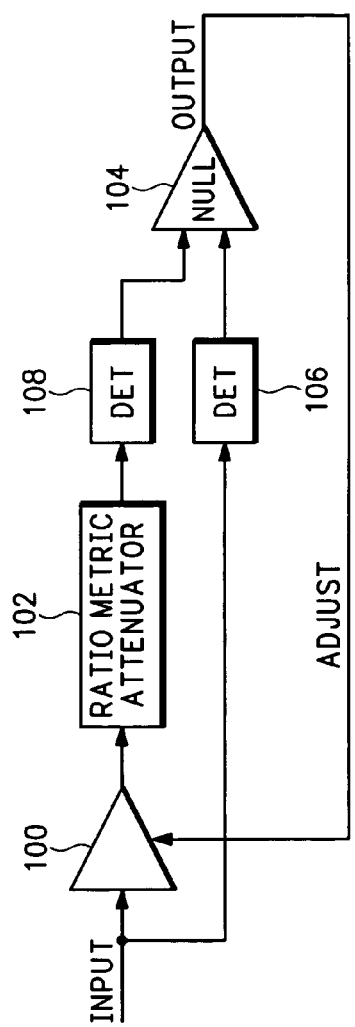
FIG. 23 illustrates another embodiment of a circuit having a gain stage and ratiometric attenuator according to the inventive principles of this patent disclosure.

FIG. 23 illustrates another embodiment of a circuit according to the inventive principles of this patent disclosure. This embodiment includes an adjustable gain stage 100 and a ratiometric attenuator 102 arranged as in the embodiment of FIG. 22, but here, the input signal is applied to the nulling circuit through a detector 106. Another detector 108, which is preferably matched to detector 106, is interposed between the attenuator and the nulling circuit. In this example, the circuit is arranged in a servo loop configuration with the output from the nulling circuit fed back as a gain control input to the gain stage.

Figure 24:
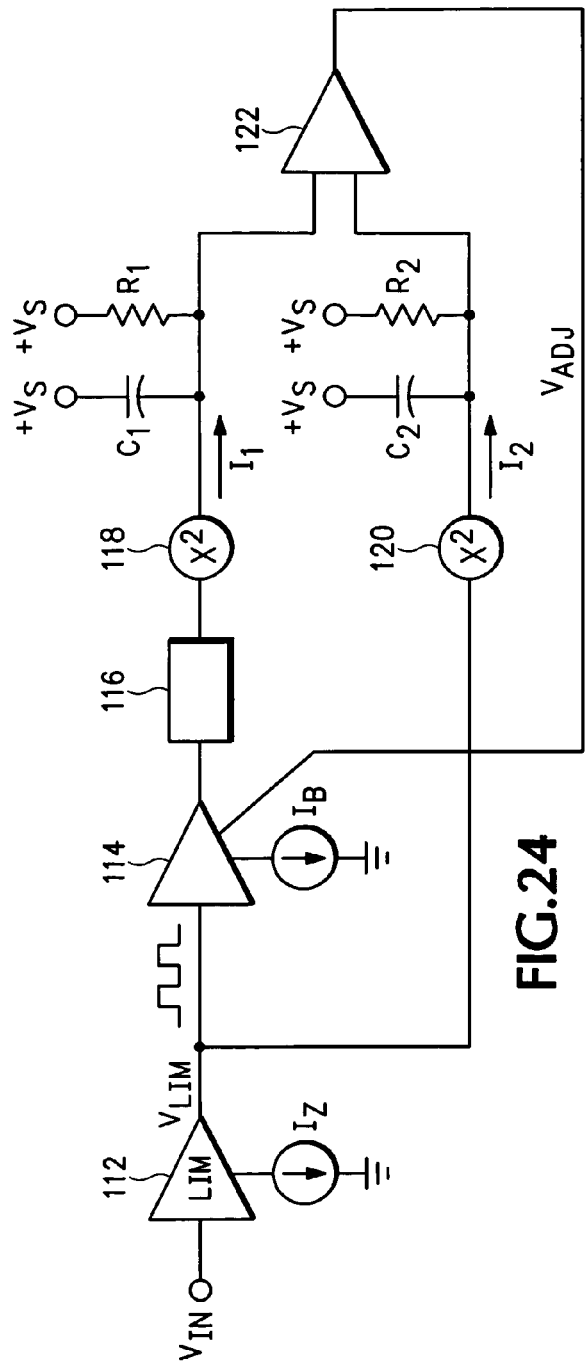
FIG. 24 illustrates another embodiment of a circuit having a gain stage and ratiometric attenuator according to the inventive principles of this patent disclosure.

FIG. 24 illustrates another embodiment of a circuit according to the inventive principles of this patent disclosure. In the embodiment of FIG. 24, the input to the gain stage 114 is provided by a limiting stage 112 which generates a limiting output signal $V_{LIM}$ with a stable swing at the same operating frequency as the input signal $V_{IN}$. For example, the limiting stage may include a transconductance ($g_m$) cell with load resistors $R_L$ and a temperature stable (ZTAT) bias current source $I_Z$. The gain of the $g_m$ cell does not matter (as long as it is high enough to cause limiting operation) because the swing is set by the combination of $I_Z$ and $R_L$ which imparts an absolute reference to the limiting signal.

The gain stage 114 may also be based on a $g_m$ cell with gain control provided by adjusting the bias current to the $g_m$ cell in response to $V_{ADJ}$ from the nulling circuit. An additional fixed bias current $I_g$ may also be provided to the $g_m$ cell to assure that some amount of gain will be present at start-up.

The detector cells in this example are implemented with squaring cells 118 and 120 which are preferably matched and provide current-mode output signals $I_1$ and $I_2$. The nulling circuit includes averaging capacitors C1 and C2, and load resistors R1 and R2 which convert the output currents from the squaring cells to voltage mode signals. A differential amplifier 122, which in this example may be an operational amplifier, generates the gain control signal $V_{ADJ}$ which servos the system to null the difference between $I_1$ and $I_2$.

With $I_1$ forced to equal $I_2$ through the nulling operation, the outputs from the squaring cells may be expressed as follows:

$$(V_{LIM})^2 = (V_{LIM} AX)^2 \qquad \text{Eq. 5}$$

where A is the gain of the gain stage 114 and X is the attenuation factor of the ratiometric attenuator 116. This reduces to 1=AX or A=1/X. Therefore, the gain may be forced to a fixed value that is determined by a ratio of component values in the attenuator.

With the input to the gain stage basically a fixed amplitude signal at a given frequency and temperature, the amplitude of the output signal from the gain stage depends solely on its gain and includes all of its temperature, frequency and process effects. Since component ratios, e.g., resistor ratios, may be fabricated to be substantially free of temperature, frequency and process effects, forcing the gain A to equal the inverse of X produces an adjustment signal $V_{ADJ}$ that essentially provides frequency stable gain, as well as compensation for temperature and process variations. Although the limiting stage may be omitted, it may provide a higher level of accuracy by keeping the squaring cells from dwelling in a low gain region of operation.

The inventive principles relating to gain control with ratiometric attenuation may be applied to any number of different applications. For example, the embodiments of FIGS. 22, 23 and 24 may be adapted to provide gain stabilization to detector circuits such as those based on log amps or interpolated VGAs.

Figure 25:
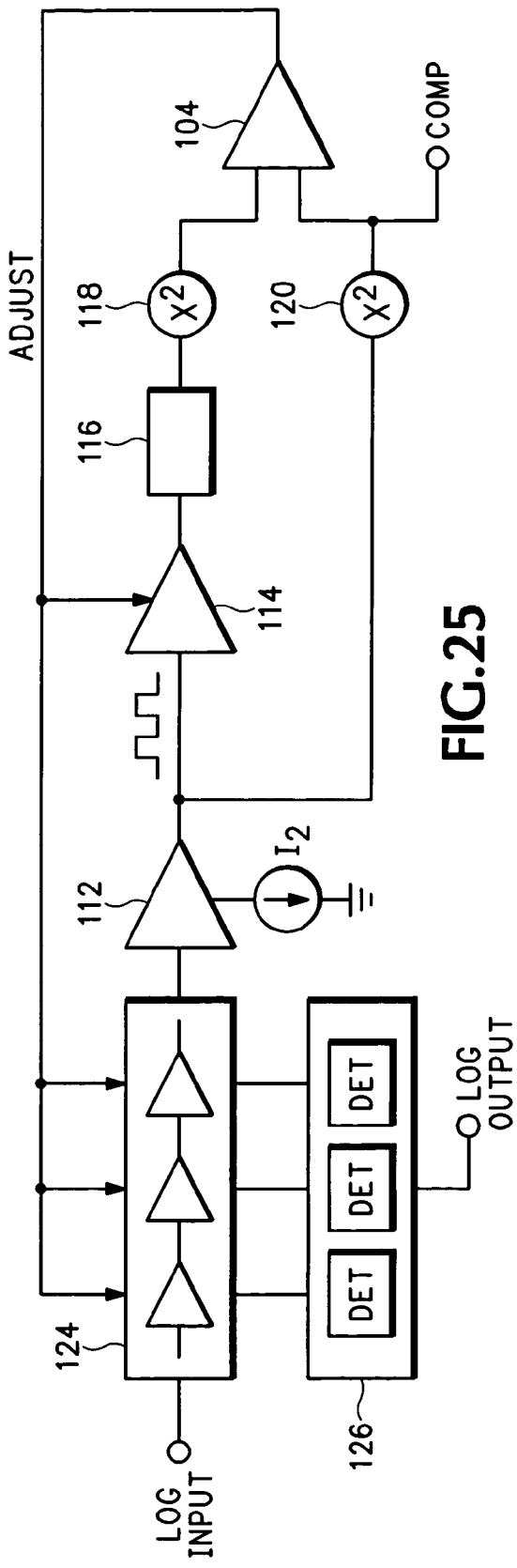
FIG. 25 illustrates an embodiment of a circuit including a log amp according to the inventive principles of this patent disclosure.

FIG. 25 illustrates an embodiment of a circuit including a log amp according to the inventive principles of this patent disclosure. The embodiment of FIG. 25 includes a progressive compression log amp having a series of cascaded gain stages 124 and a series of detector cells 126 in which each detector cell is connected to a corresponding gain stage. The outputs of the detector cells are summed to generate the log output signal LOG OUT. The output from the final cascaded gain stage is applied the input of limiting stage 112. The limiting stage 112, gain stage 114, attenuator 116, squaring cells 118, 120 and nulling circuit 104 operate in much the same way as the embodiment of FIG. 24. In the embodiment of FIG. 25, however, the feedback signal ADJUST from the nulling circuit may used to control the gain of one or more of the series of cascaded gain stages 124 in addition to, or instead of, the gain stage 114.

Figure 1:
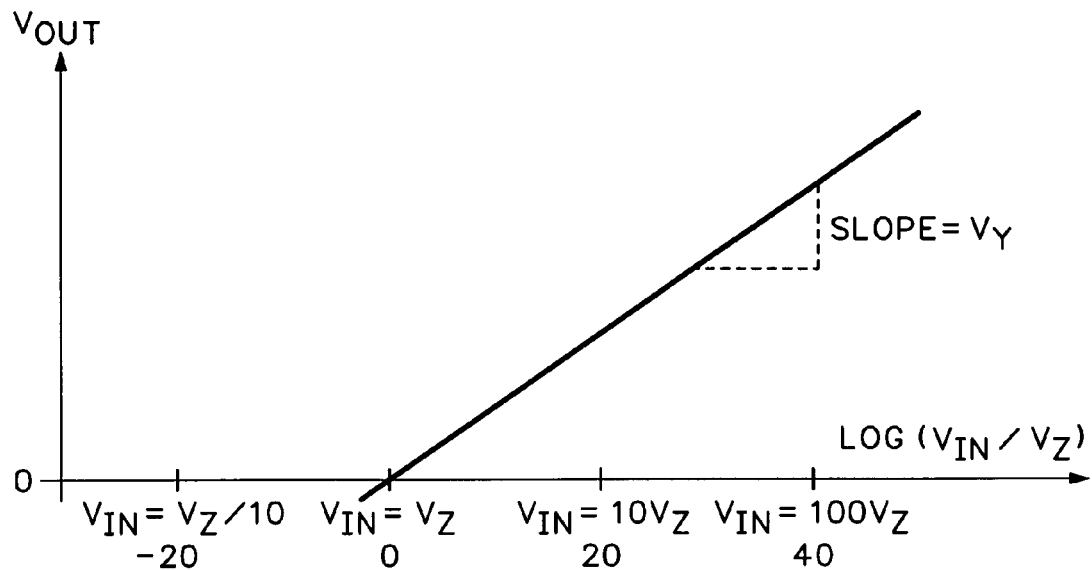
FIG. 1 illustrates an idealized log amp function.
Figure 2:
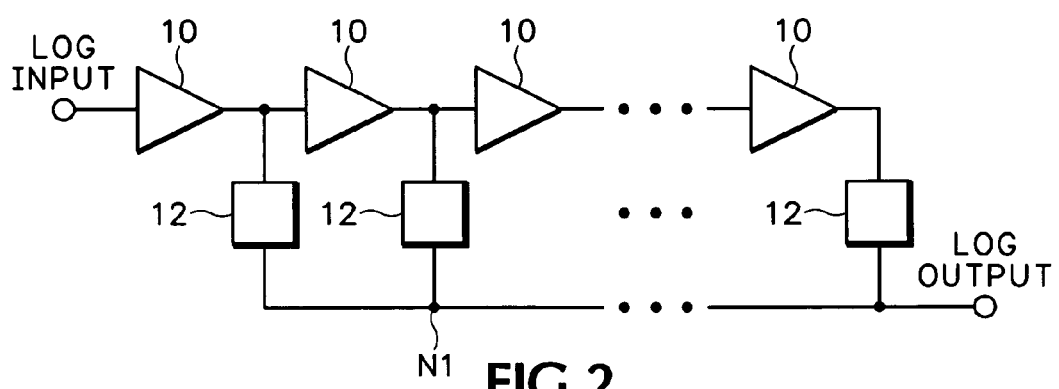
FIG. 2 illustrates a prior art progressive compression log amp.
Figure 3:
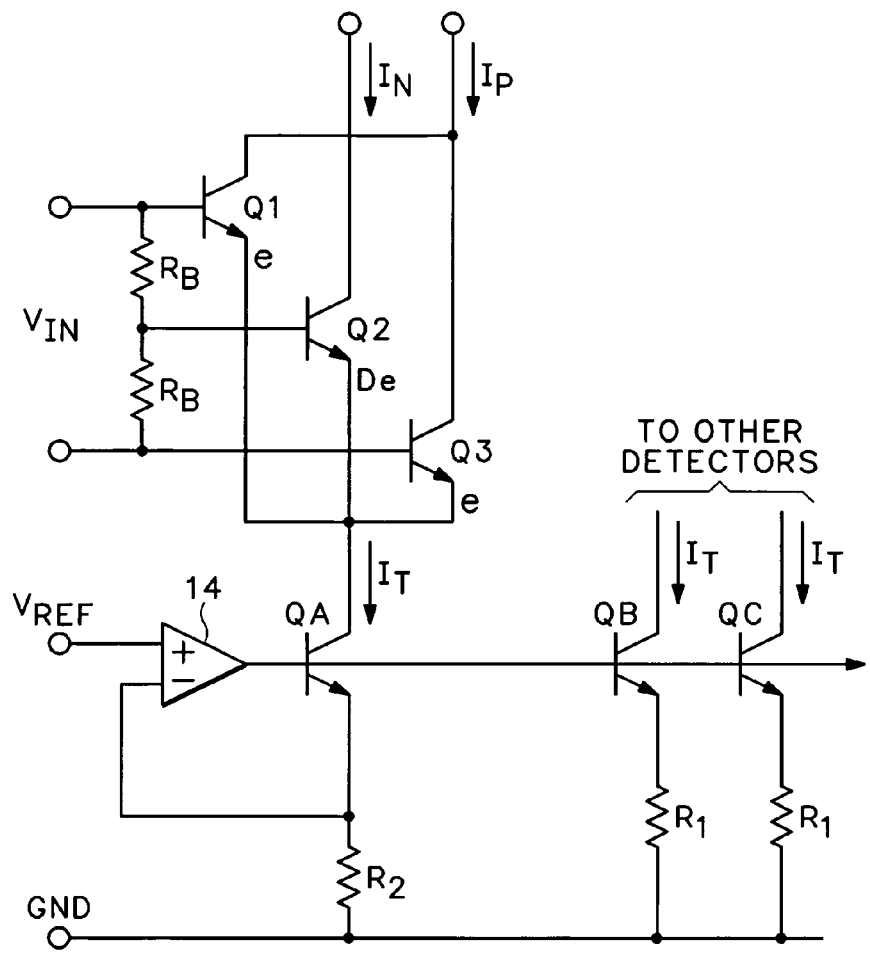
FIG. 3 illustrates a prior art detector cell for a progressive compression log amp.
Figure 4:
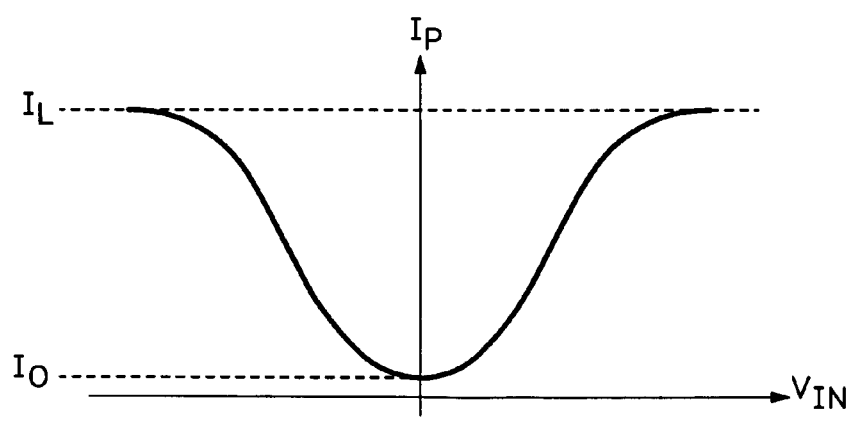
FIG. 4 illustrates the form of one output of the detector cell of FIG. 3.
Figure 5:
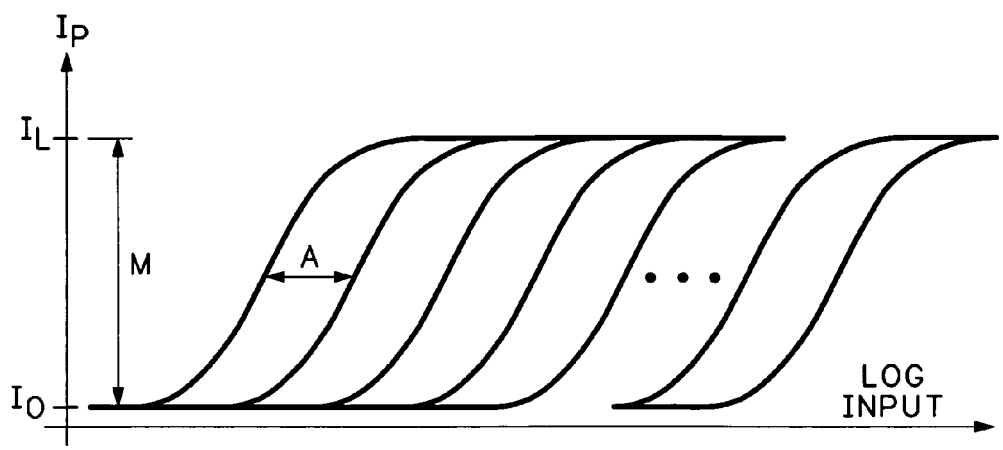
FIG. 5 illustrates the logarithmic form of the outputs form of several detector cells in a prior art progressive compression log amp.
Figure 6:
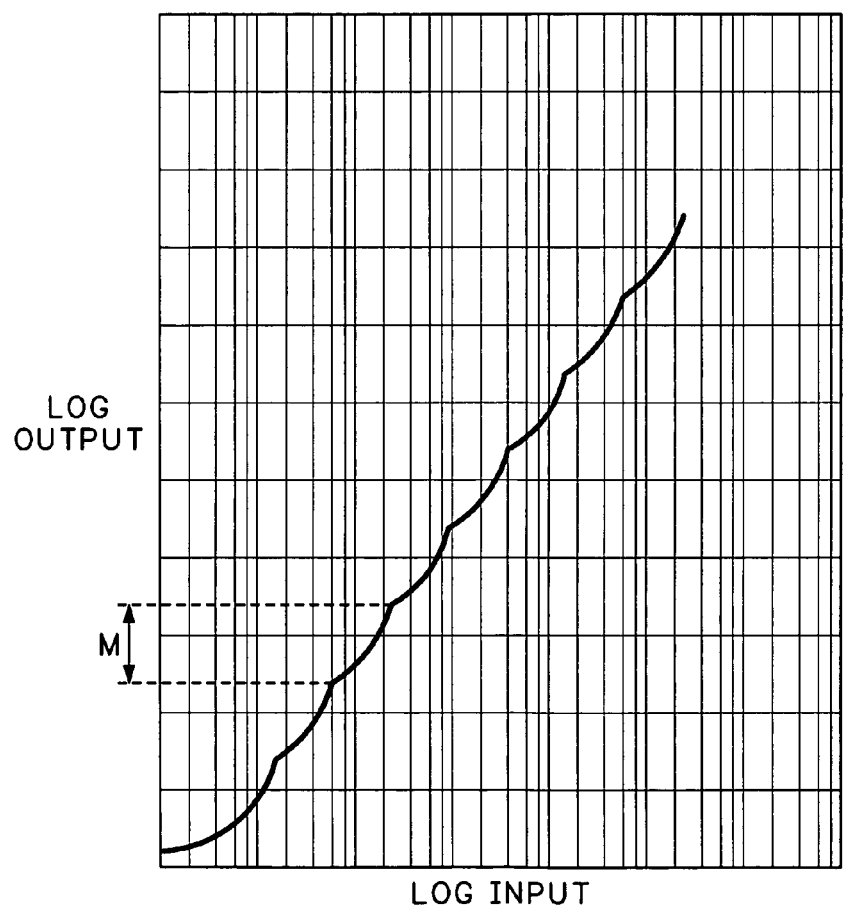
FIG. 6 illustrates the final output function obtained by summing together the outputs from several of the prior art detector cells of FIG. 3.
Figure 7:
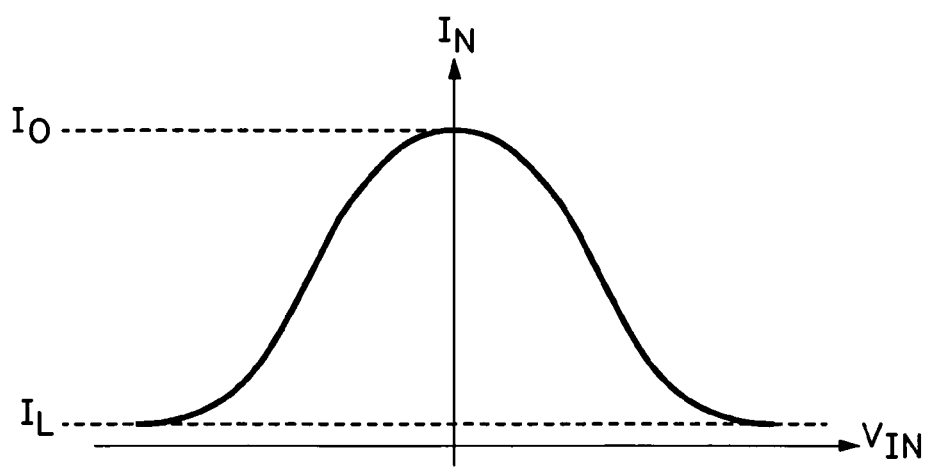
FIG. 7 illustrates the form of another output of the detector cell of FIG. 3.
Figure 8:
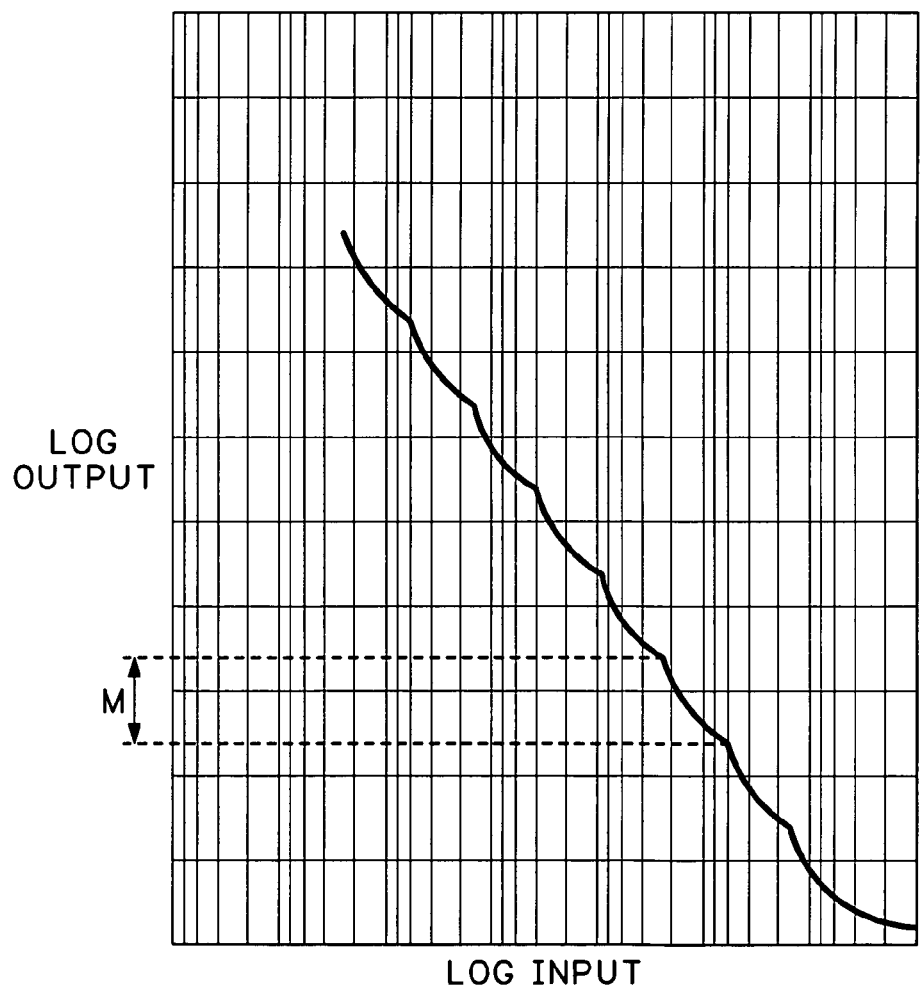
FIG. 8 illustrates the final output function obtained by summing together the other outputs from several of the prior art detector cells of FIG. 3.
Figure 9:
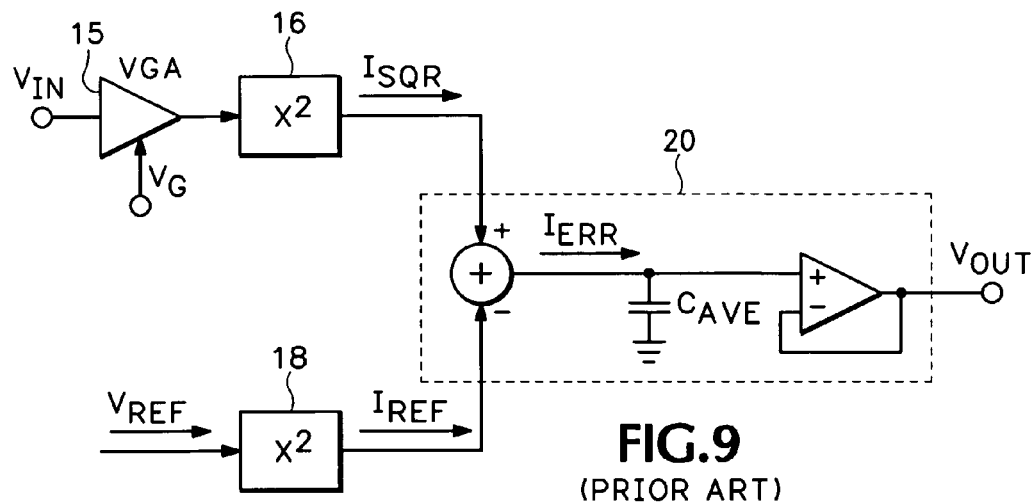
FIG. 9 illustrates a prior art power detection circuit that that implements a difference of squares function.

Whereas the inventive principles described above in the context of the embodiments of FIGS. 10 through 13 may provide compensation by stabilizing the detector signal swing M as shown in FIG. 5, inventive principles described in the context of the embodiment of FIG. 25 may be implemented in the same log amp to provide compensation by stabilizing the stage gain A. Thus, the inventive principles of this patent disclosure may be implemented synergistically to provide a robust logarithmic amplifier with accurate compensation of both slope and/or intercept for temperature, frequency, process, and other effects.

Moreover, by implementing the progressive compression log amp of FIG. 25 as part of a main signal path, and by implementing the squaring cell 120 as part of a reference signal path, the output from squaring cell 120 may be utilized as a compensation signal COMP to provide compensation in much the same manner as the reference signal in the embodiments of FIGS. 14 and 16. Thus, signals generated through implementation of some of the inventive principles of this patent disclosure may be reused in implementation of other inventive principles in the same circuit, thereby providing further beneficial results. As a further example, zero and limiting detectors may be included along with a feedback loop as discussed above to maintain the difference between the zero and limiting outputs at a fixed or selected value.

The inventive principles described above in the context of the embodiments of FIGS. 22 through 24 may provide further benefits depending on the implementation. For example, precision biasing techniques that have been used to compensate bipolar junction transistor (BJT) log amps are generally ineffective in detector circuits implemented with low cost complementary metal oxide semiconductor (CMOS) technology. The inventive principles described above may provide enough compensation to produce CMOS detector circuits with acceptable accuracy at high operating frequencies. Furthermore, the closed loop gain control according to the inventive principles of this patent disclosure may extend the useful operating range of gain stages by increasing bias current, and therefore the gain, at frequencies where the gain of a fixed bias gain stage would otherwise be rolling off.

The inventive principles described above may also be utilized in circuits that are coupled to, or integrated with, interpolated VGAs. For example, a VGA detector circuit may be created by simply placing a variable attenuator at the input to any of the embodiments of FIGS. 22, 23 and 24.

Figure 26:
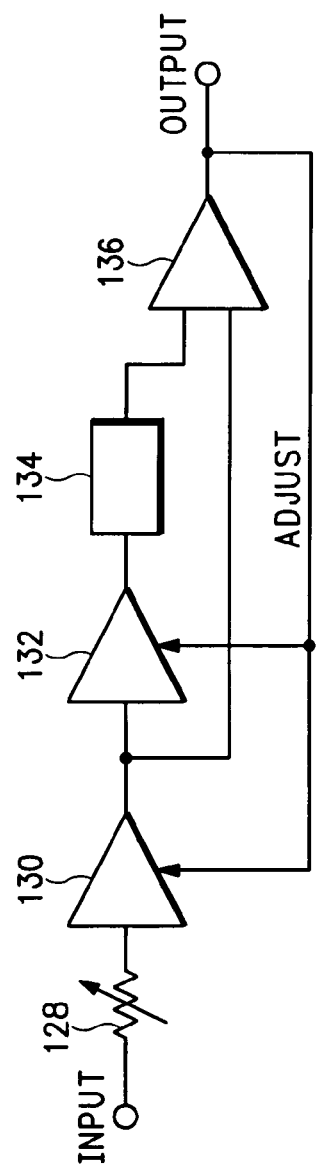
FIG. 26 illustrates an embodiment of an interpolated VGA detector circuit according to the inventive principles of this patent disclosure.

FIG. 26 illustrates an embodiment of an interpolated VGA detector circuit according to the inventive principles of this patent disclosure. The embodiment of FIG. 26 includes a variable attenuator 128 followed by a main amplifier 130. The output from the main amp is applied to an adjustable gain stage 132 which is followed by a ratiometric attenuator 134. A nulling circuit 136 nulls the outputs from the main amp 130 and attenuator by servoing the system with a feedback signal ADJUST which may be applied to either or both of the main amp 130 or gain stage 132.

Figure 27:
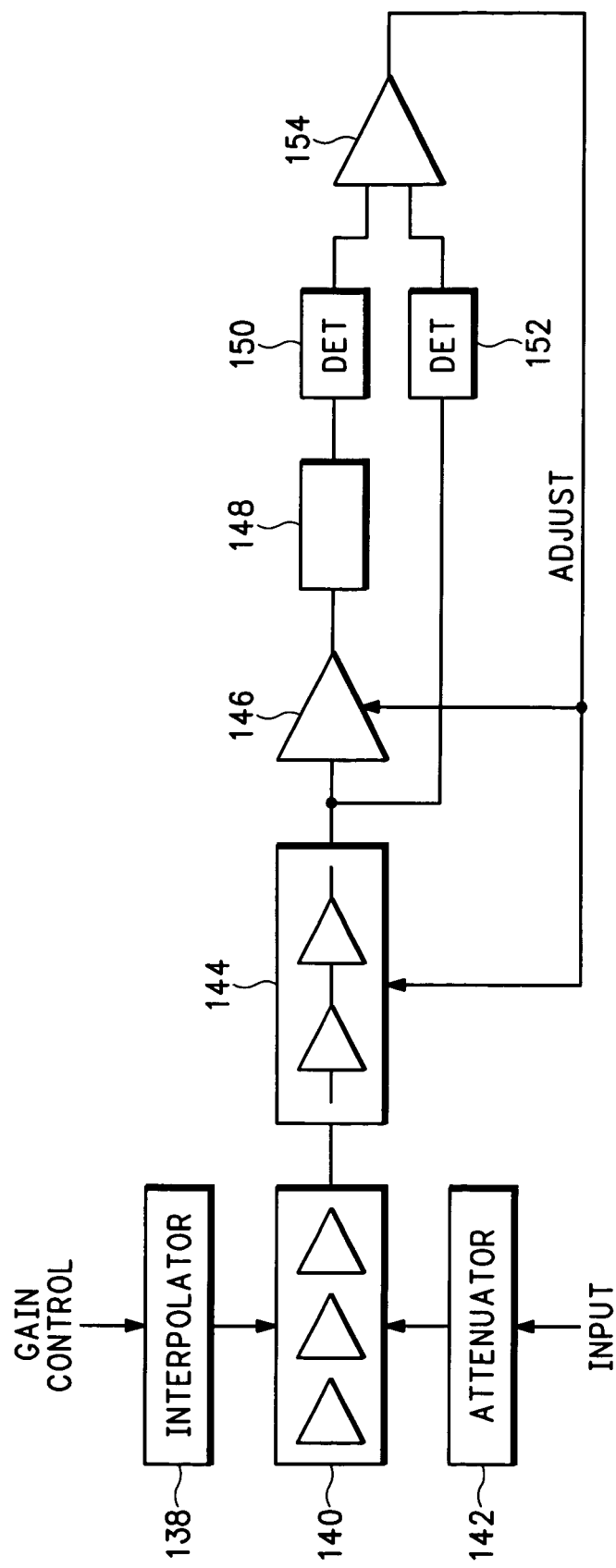
FIG. 27 illustrates another embodiment of an interpolated VGA detector circuit according to the inventive principles of this patent disclosure.

FIG. 27 illustrates another embodiment of an interpolated VGA detector circuit according to the inventive principles of this patent disclosure. In the embodiment of FIG. 27, a variable attenuator is implemented with an attenuator 142, an input section 140, and an interpolator 138 which form the basic topology of a type of VGA described in U.S. Pat. No. 5,077,541 and sold under the trademark X-AMP®. The input section acts as a steering core which, in this example, is located in the signal path after the attenuator. A main amplifier 144 having adjustable gain may include one or more cascaded gain stages. The output from the main amp is applied to an adjustable gain stage 146, which is followed by a ratiometric attenuator 148. The outputs from the main amp and ratiometric attenuator are applied to a pair of detector cells 150,152 and then a nulling circuit 154 which generates an output signal ADJUST that may be applied to either or both of the main amp 144 or gain stage 146. The main amplifier may variously be referred to as a post amp, an output stage, an output amp, etc., and is often, but not necessarily, implemented as a transimpedance amplifier that converts a current output from the attenuator to a voltage mode signal.

FIG. 28 illustrates a differential embodiment that integrates an interpolated VGA detector circuit and a gain compensation scheme having an adjustable gain stage and ratiometric attenuator, and which may implement a difference of squares function according to the inventive principles of this patent disclosure. The embodiment of FIG. 28 includes an attenuator, an input section having a number of input transistor pairs, and an interpolator arranged as shown in the embodiment of FIG. 27. For simplicity, the attenuator and interpolator are omitted from the drawing, and only one of the input pairs Q1,Q2 is shown. The input $V_N$ to the input pair is one of the attenuator outputs, and the bias current $I_N$ is one of the interpolator outputs. The other input pairs would have their collector outputs commonly connected with the collectors of Q1,Q2, and their signal and bias inputs would be connected to the other attenuator and interpolator outputs, respectively.

Load resistors $R_L$ convert the current outputs from the input pairs to a voltage signal which is applied to an output stage 156. An active feedback stage having one or more active feedback cells such as differential pair Q3,Q4 may be arranged in an active feedback amplifier (AFA) arrangement as shown in FIG. 28. A main amplifier 158 may be implemented with a series of gain stages 158A, 158B, 158C, . . . using, for example, a series of A/1 or A/0 amplifier/limiter stages such as the type used in progressive compression log amps. The main amp is followed by a limiting stage 160 which may be biased by a stable current $I_Z$ to provide an absolute reference for the limited output signal $W_{LIM}$. The limiting output is applied to a gain stage 162 followed by a ratiometric attenuator 164. $V_{LIM}$ and the output from the ratiometric attenuator are applied to a nulling circuit 170 through a pair of matched squaring cells 166 and 168. The output $V_{ADJ}$ from the nulling circuit may be fed back to various combinations of the gain stages in the signal path to provide gain stabilization/compensation. In this example, it is used to control the gain of gain stage 162, the cascaded main amp stages 158, and the output stage 156 in the AFA arrangement.

The difference of squares function may be implemented in various ways with the embodiment of FIG. 28. For example, the output from the main amp 158 may be applied to a third squaring cell 172 which has its output combined with the output of squaring cell 168 to provide a final output signal $V_{OUT}$ through nulling circuit 174. Thus, in the embodiment of FIG. 28 several of the inventive principles of this patent disclosure are woven together to implement a main amplifier for an interpolated VGA using a series of gain stages that may be compensated for temperature and frequency effects and with an accurate gain that may be referenced to a ratio of components.

The inventive principles of this patent disclosure have been described above with reference to some specific example embodiments, but these embodiments can be modified in arrangement and detail without departing from the inventive concepts. For example, some transistors have been illustrated as bipolar junction transistors (BJTs), but CMOS and other types of devices may be used as well. Some signals and mathematical values have been illustrated as voltages or currents, but the inventive principles of this patent disclosure are not limited to these particular signal modes. As a further example, some of the embodiments described above are shown as single-sided implementations (e.g., FIG. 12), but differential implementations may also be used. In yet another example, the embodiments described above with reference to FIGS. 23-28 may be implemented with the gain stage and attenuator in reverse order as shown in FIG. 29.

Moreover, additional benefits may be realized when some of the principles are utilized in various combinations with one another, thus giving rise to yet more patentable inventions. Since the embodiments described above can be modified in arrangement and detail without departing from the inventive concepts, such changes and modifications are considered to fall within the scope of the following claims.

The invention claimed is:

1. A circuit comprising:
   a main path to generate an output signal in response to an input signal; and
   a reference path coupled to the main path to generate a reference signal in response to the input signal to compensate the output signal by subtracting an inverse of the reference signal from the output signal;
   the reference path including a detector separate from the main path and matched to a detector in the main path.

2. The circuit of claim 1 where the reference path is arranged to reuse a signal from the main path.

3. The circuit of claim 1 where the main path and reference path further include matched amplifiers to drive the detectors.

4. The circuit of claim 1 where the reference path is arranged to generate the reference signal in response to the input signal and a second reference signal.

5. The circuit of claim 4 where the second reference signal includes a bandgap signal.

6. The circuit of claim 4 where the second reference signal includes a feedback signal derived from the output signal.

7. The circuit of claim 4 where the second reference signal includes a setpoint signal.

8. The circuit of claim 1 where:
   the main path includes a progressive compression log amp having a series of gain stages coupled to a series of detectors; and
   the reference path includes a gain stage matched to the series of gain stages, and a detector matched to the series of detectors.

9. The circuit of claim 8 where the gain stage in the reference path may be scaled by a second reference signal.

10. The circuit of claim 9 where the second reference signal establishes an intercept for the log amp.

11. The circuit of claim 8 where the gain stage in the reference path is arranged at the end of the series of gain stages.

12. The circuit of claim 11 where the gain stage in the reference path is arranged to limit at the operating frequency of the series of gain stages.

13. The circuit of claim 12 where the gain stage in the reference path is arranged to limit at an amplitude determined by a second reference signal.

14. The circuit of claim 8 where the detector in the reference path is coupled to the series of detectors in the main path to compensate the output signal.

15. A method comprising:
   generating an output signal in response to an input signal through a main path;
   generating a reference signal in response to the input signal through a reference path, the reference path including a detector separate from the main path and matched to a detector in the main path; and
   compensating the output signal by subtracting an inverse of the reference signal from the output signal.

16. The method of claim 15 where generating the reference signal includes reusing a signal available in the main path.

* * * * *